United States Patent
Lee et al.

(10) Patent No.: US 7,508,232 B2
(45) Date of Patent: Mar. 24, 2009

(54) DATA OUTPUT DRIVER

(75) Inventors: Dong Uk Lee, Kyoungki-do (KR); Shin Deok Kang, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/779,337

(22) Filed: Jul. 18, 2007

(65) Prior Publication Data
US 2008/0157811 A1 Jul. 3, 2008

(30) Foreign Application Priority Data
Dec. 27, 2006 (KR) .................. 10-2006-0135720

(51) Int. Cl.
*H03K 17/16* (2006.01)
(52) U.S. Cl. ........................... 326/30; 327/308
(58) Field of Classification Search ................ 326/30, 326/82, 83, 86; 327/308
See application file for complete search history.

(56) References Cited

U.S. PATENT DOCUMENTS

| 6,445,316 B1 * | 9/2002 | Hsu et al. ............ 341/120 |
| 6,633,178 B2 * | 10/2003 | Wilcox et al. ............ 326/30 |
| 7,323,900 B2 * | 1/2008 | Kim ........................ 326/30 |

FOREIGN PATENT DOCUMENTS

| JP | 2005-039549 A | 2/2005 |
| KR | 1995-0005014 B1 | 5/1995 |
| KR | 2004-0095912 A | 11/2004 |
| KR | 2007-0036473 A | 4/2007 |

* cited by examiner

*Primary Examiner*—Daniel D Chang
(74) *Attorney, Agent, or Firm*—Ladas & Parry LLP

(57) ABSTRACT

A data output driver that reduces signal skew includes a data multiplexer which reduces a load of a path through which a pull-up/pull-down control signal is generated by a logic-combination of a data signal. It also decreases the number of bits of a pull-up/pull-down resistance-adjusting code signal, and outputs a data signal in response to high impedance information. Furthermore, a path of an output circuit is simplified through which a pull-up/pull-down control is generated in response to the data signal output from the data multiplexer.

40 Claims, 12 Drawing Sheets

DATA OUTPUT DRIVER

CROSS-REFERENCE TO RELATED APPLICATIONS

The present application claims priority to Korean patent application number 10-2006-0135720 filed on Dec. 27, 2006, which is incorporated herein by reference in its entirety.

BACKGROUND OF THE INVENTION

The present invention relates to a data output driver of a semiconductor device, and more particularly, to a data output driver that reduces a signal skew.

In general, in order to restrict reflection of a signal transmitted through a transmission channel, a transmitting/receiving stage of a semiconductor device is connected with a termination resistor having the same resistance as an impedance of the transmission channel. Such a device is called as an on-die termination (hereinafter, referred to as an ODT).

A data output driver of a semiconductor device includes a data multiplexer, an ODT calibration circuit, and an output circuit.

The data multiplexer receives a 2-bit input data signal to output a 1-bit data signal in response to rising and falling edges of a data output clock. The ODT calibration circuit performs an impedance calibration operation in proportion to a reference resistance/impedance and outputs a resistance-adjusting code signal to the output circuit. The output circuit generates a pull-up control signal and a pull-down control signal by combining an enable signal which is generated in response to a data signal, the resistance-adjusting code signal, and an extended mode resistor set (hereinafter, referred to as an EMRS) signal. Further, the output circuit outputs data by selectively driving a pull-up driver and a pull-down driver.

In this case, the enable signal and the resistance-adjusting code signal supplied to the output circuit are static signals, whereas the data signal is a signal that is toggled rapidly. However, the conventional output circuit is constructed with a NOR gate or a NAND gate having a large load without consideration of characteristics of the data signal. Further, the enable signal and the resistance-adjusting code signal are combined to output the pull-up control signal and the pull-down control signal. Thus, there is a problem in that skew occurs in the output data signal. In particular, the NOR gate in which PMOS transistors are connected in series cannot be rapidly toggled at low power. Therefore, skew of the generated control signal increases.

SUMMARY OF THE INVENTION

The present invention provides a data output driver that reduces skew of an output data signal by reducing a load of a path through which pull-up and pull-down control signals are generated by the NAND-combination of a data signal.

The present invention also provides a data output driver in which the number of bits of a resistance-adjusting code signal is reduced by enabling a most significant bit (MSB) of an ODT calibration circuit so as to simplify the path through which the pull-up and pull-down control signals are generated, thereby reducing the skew of the output data signal.

The present invention also provides a data output driver which includes a data multiplexer which outputs a data signal containing high impedance information and reduces the skew of the output data signal by simplifying the path through which the pull-up and pull-down control signals are generated in response to the data signal.

The present invention also provides a data output driver having a reduced area by simplifying the path through which the pull-up and pull-down control signals are generated.

The present invention also provides a low power data output driver by simplifying the path through which the pull-up and pull-down control signals are generated.

According to an aspect of the present invention, there is provided a data output driver comprising: a data multiplexer which provides a pull-up/pull-down data signal; an on-die termination calibration circuit which provides an N bit (N is a natural number) pull-up/pull-down resistance-adjusting code signal; and an output circuit which includes a plurality of pull-up/pull-down pre-drivers and a plurality of pull-up/pull-down drivers and outputs a data signal when the pull-up/pull-down drivers are driven in response to an M bit (M is a natural number) pull-up/pull-down control signal selected in response to an enable signal and obtained by a logic-combination of the pull-up/pull-down resistance-adjusting code signal and the pull-up/pull-down data signal.

In the aforementioned aspect of the present invention, the enable signal may be obtained from an extended mode resister set.

In addition, each of the pull-up/pull-down pre-drivers may include pull-up/pull-down control signal generators which generate the pull-up/pull-down control signal by the NAND combination of the pull-up/pull-down resistance-adjusting code signal and the pull-up/pull-down data signal.

In addition, each of the pull-up/pull-down pre-drivers may include the pull-up/pull-down control signal generators as many as the number of bits of the pull-up/pull-down control signal.

In addition, the pull-up control signal generator may comprise: a driving element in which the pull-up resistance-adjusting code signal is NOR-combined with an inversion signal of the enable signal, a signal obtained by the NOR-combination is then NAND-combined with the pull-up data signal, and a signal obtained by the NAND-combination is then inverted to output a pull-up driving signal; and an output element which receives the pull-driving signal to output the pull-up control signal.

In addition, the pull-down control signal generator may comprise: a driving element in which an inversion signal of the pull-down resistance-adjusting code signal is NOR-combined with an inversion signal of the enable signal, and a signal obtained by the NOR-combination is then NAND-combined with the pull-down data signal to output a pull-down driving signal; and an output element which receives the pull-down driving signal to output the pull-down driving signal.

In addition, the output element may comprise: a CMOS inverter which inverts the pull-up/pull-down driving signal; and a resistor which receives an output of the CMOS inverter to output the pull-up/pull-down control signal.

According to another aspect of the present invention, there is provided a data output driver comprising: a data multiplexer which provides a pull-up/pull-down data signal; an on-die termination calibration circuit which provides an N−1 bit (N is a natural number equal to or greater than 2) pull-up/pull-down resistance-adjusting code signal; and an output circuit which includes a plurality of pull-up/pull-down pre-drivers and a plurality of pull-up/pull-down drivers and outputs a data signal when the pull-up/pull-down drivers are driven in response to an M bit (M is a natural number) pull-up/pull-down control signal selected in response to an enable signal and obtained by a logic-combination of the pull-up/pull-down resistance-adjusting code signal and the pull-up/pull-down data signal.

In the aforementioned aspect of the present invention, the enable signal may be obtained from an extended mode resister set.

In addition, the on-die termination calibration circuit may include a pull-up/pull-down calibration driver constructed with N pull-up/pull-down fingers and outputs the N−1 bit pull-up/pull-down resistance-adjusting code signal by allowing an output of a finger corresponding to the MSB of the pull-up/pull-down fingers to be fixed at an enable state.

In addition, the pull-up/pull-down pre-driver may comprise: N−1 first pull-up/pull-down control signal generators which logic-combine the pull-up/pull-down data signal, the pull-up/pull-down resistance-adjusting code signal, and the enable signal to generate the pull-up/pull-down control signal; and one second pull-up/pull-down control signal generator which logic-combines the pull-up/pull-down data signal and the enable signal to generate the pull-up/pull-down control signal.

In addition, the first pull-up control signal generator may comprise: a driving element in which the pull-up resistance-adjusting code signal is NOR-combined with an inversion signal of the enable signal, a signal obtained by the NOR-combination is then NAND-combined with the pull-up data signal, and a signal obtained by the NAND-combination is then inverted to output a pull-up driving signal; and an output element which receives the pull-driving signal to output the pull-up control signal.

In addition, the first pull-down control signal generator may comprise: a driving element in which an inversion signal of the pull-down resistance-adjusting code signal is NOR-combined with an inversion signal of the enable signal, and a signal obtained by the NOR-combination is then NAND-combined with the pull-down data signal to output a pull-down driving signal; and an output element which receives the pull-down driving signal to output the pull-down driving signal.

In addition, the second pull-up control signal generator may comprise: a driving element which NAND-combines and inverts the enable signal and the pull-up data signal to output a pull-up driving signal; and an output element which receives the pull-up driving signal to output the pull-up control signal.

In addition, the second pull-down control signal generator may comprise: a driving element which NAND-combines the enable signal and the pull-down data signal to output a pull-down driving signal; and an output element which receives the pull-down driving signal to output the pull-down control signal.

In addition, the output element may comprise: a CMOS inverter which inverts the pull-up/pull-down driving signal; and a resistor which receives an output of the CMOS inverter to output the pull-up/pull-down control signal.

According to still another aspect of the present invention, there is provided a data output driver comprising: a first data multiplexer which provides a first pull-up/pull-down data signal; a second data multiplexer which provides a second pull-up/pull-down data signal in response to a high impedance signal provided from an extended mode resister set; an on-die termination calibration circuit which provides an N−1 bit (N is a natural number equal to or greater than 2) pull-up/pull-down resistance-adjusting code signal; and an output circuit which includes a plurality of pull-up/pull-down pre-drivers and a plurality of pull-up/pull-down drivers and outputs a data signal when the pull-up/pull-down drivers are driven in response to an M bit (M is a natural number) pull-up/pull-down control signal selected in response to an enable signal and obtained by a logic-combination of the pull-up/pull-down resistance-adjusting code signal and the pull-up/pull-down data signal.

In the aforementioned aspect of the present invention, the enable signal may be obtained from an extended mode resister set.

In addition, the second data multiplexer may comprise: a selector which selectively outputs an input data signal at rising and falling edges of a clock signal; a switch which controls an output signal of the selector in response to the high impedance signal; and an output buffer which receives an output signal of the switch to transmit the second pull-up/pull-down data signal.

In addition, the switch may comprise: a PMOS transistor connected between an output stage and a power stage of the selector; and an NMOS transistor connected between the output stage and a ground stage of the selector.

In addition, the switch may comprise: a first switch which receives the output signal of the selector to transmit the second pull-up data signal when a power voltage is supplied to the gate of the PMOS transistor, and the high impedance signal is supplied to the gate of the NMOS transistor; and a second switch which receives the output signal of the selector to transmit the second pull-down data signal when the high impedance signal is supplied to the gate of the PMOS transistor, and a ground voltage is supplied to the gate of the NMOS transistor.

In addition, the on-die termination calibration circuit may include a pull-up/pull-down calibration driver constructed with N pull-up/pull-down fingers and outputs the N−1 bit pull-up/pull-down resistance-adjusting code signal by allowing an output of a finger corresponding to the MSB of the pull-up/pull-down fingers to be fixed at an enable state.

In addition, the pull-up/pull-down pre-driver may comprise: first pull-up/pull-down pre-drivers which logic-combine the first pull-up/pull-down data signal and the enable signal to output the pull-up/pull-down control signal; and second pull-up/pull-down pre-drivers which receive the second pull-up/pull-down signal to output a pull-up/pull-down control signal.

In addition, each of the first pull-up/pull-down pre-drivers may comprise: N−1 first pull-up/pull-down control signal generators which receive the first pull-up/pull-down data signal, the enable signal, and the pull-up/pull-down resistance-adjusting code signal to output the pull-up/pull-down control signal; and one second pull-up/pull-down control signal generator which receives the first pull-up/pull-down data signal and the enable signal to output the pull-up/pull-down control signal.

In addition, the first pull-up control signal generator may comprise: a driving element in which the pull-up resistance-adjusting code signal is NOR-combined with an inversion signal of the enable signal, a signal obtained by the NOR-combination is then NAND-combined with the first pull-up data signal, and a signal obtained by the NAND-combination is then inverted to output a pull-up driving signal; and an output element which receives the pull-driving signal to output the pull-up control signal.

In addition, the first pull-down control signal generator may comprise: a driving element in which an inversion signal of the pull-down resistance-adjusting code signal is NOR-combined with an inversion signal of the enable signal, and a signal obtained by the NOR-combination is then NAND-combined with the first pull-down data signal to output a pull-down driving signal; and an output element which receives the pull-down driving signal to output the pull-down driving signal.

In addition, the second pull-up control signal generator may comprise: a driving element which NAND-combines and inverts the enable signal and the first pull-up data signal to output a pull-up driving signal; and an output element which receives the pull-up driving signal to output the pull-up control signal.

In addition, the second pull-down control signal generator may comprise: a driving element which NAND-combines the enable signal and the first pull-down data signal to output a pull-down driving signal; and an output element which receives the pull-down driving signal to output the pull-down control signal.

In addition, the output element may comprise: a CMOS inverter which inverts the pull-up/pull-down driving signal; and a resistor which receives an output of the CMOS inverter to output the pull-up/pull-down control signal.

In addition, each of the second pull-up/pull-down pre-drivers may comprise: N−1 first pull-up/pull-down control signal generators which receive the second pull-up/pull-down data signal and the pull-up/pull-down resistance-adjusting code signal to output the pull-up/pull-down control signal; and one second pull-up/pull-down control signal generator which receives the second pull-up/pull-down data signal to output the pull-up/pull-down control signal.

In addition, the first pull-up/pull-down may comprise: a driving element which NAND-combines and inverts the pull-up resistance-adjusting code signal and the second pull-up data signal to output a pull-up driving signal; and an output signal which receives the pull-up driving signal to output the pull-up control signal.

In addition, the first pull-down control signal generator may comprise: a driving element which NAND-combines the pull-down resistance control code signal and the second pull-down data signal to output a pull-down driving signal; and an output element which receives the pull-down driving signal to output the pull-down control signal.

In addition, the second pull-up control signal generator may comprise: a driving element which buffers the second pull-up data signal to output a pull-up driving signal, and an output element which receives the pull-up driving signal to output the pull-up control signal.

In addition, the second pull-down control signal generator may comprise: a driving element which buffers the second pull-down data signal to output a pull-down driving signal; and an output element which receives the pull-down driving signal to output the pull-down control signal.

In addition, the output element may comprise: a CMOS inverter which inverts the pull-up/pull-down driving signal; and a resistor which receives an output of the CMOS inverter to output the pull-up/pull-down control signal.

In addition, the output driver may comprise one or more pull-up/pull-down drivers each having a different resistance/impedance, and the pull-up/pull-down driver having a minimum resistance/impedance is driven in response to the pull-up/pull-down control signal generated in response to the second pull-up/pull-down data signal.

DESCRIPTION OF SPECIFIC EMBODIMENTS

Hereinafter, the present invention will be described in detail with reference to the accompanying drawings.

The present invention relates to a data output driver in which data signals are combined by a logic element having a slow loading time, or the number of bits of a signal output from an ODT calibration circuit is reduced, or information regarding on high impedance is contained in the data signal. Therefore, pull-up and pull-down control signals can be rapidly generated, and a path of an output circuit generating the pull-up and pull-down control signals can be simplified. Accordingly, skew of output data can be improved.

Figure 1:
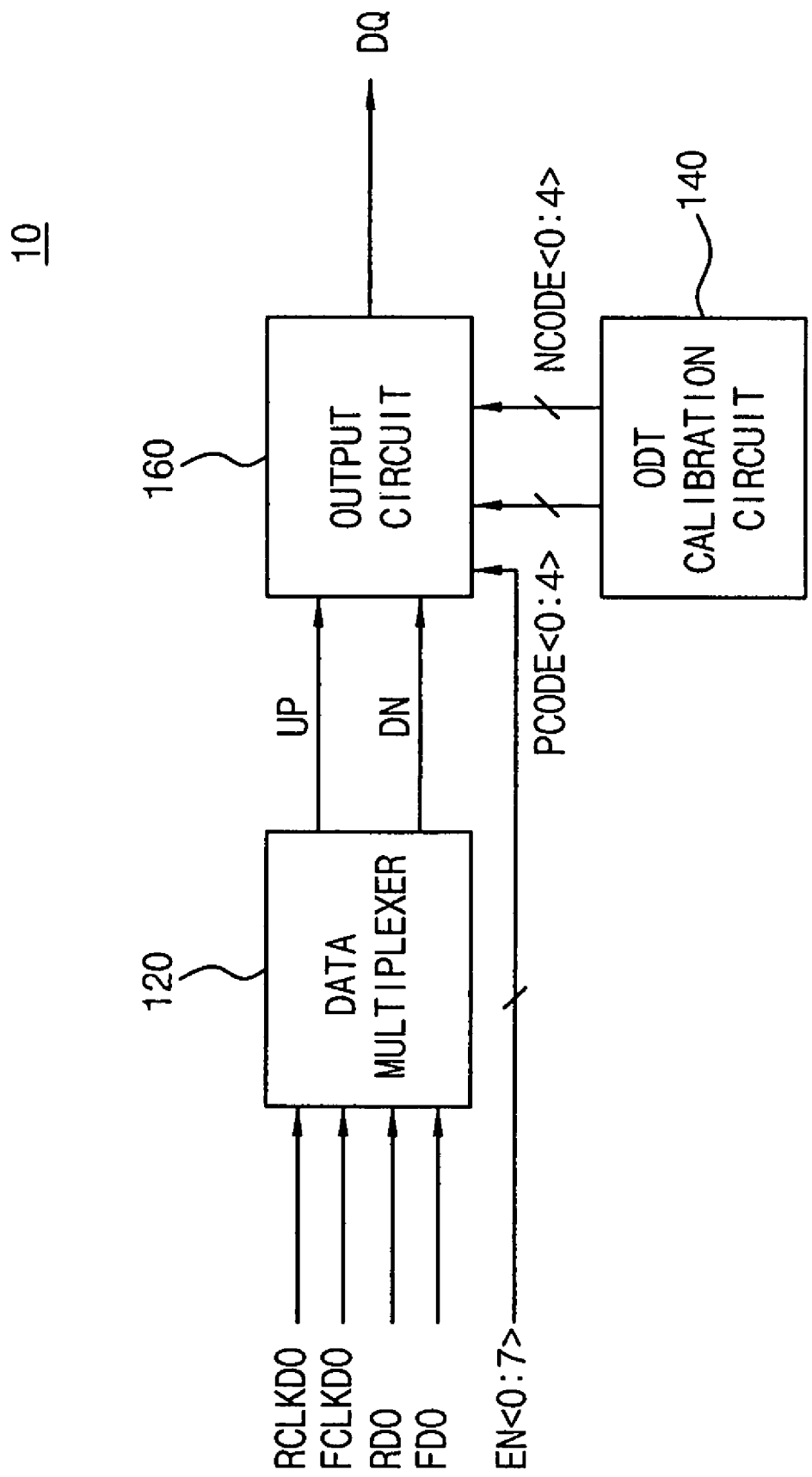
FIG. 1 is a block diagram of a data output driver according to a first embodiment of the present invention.

Referring to FIG. 1, a data output driver 10 according to a first embodiment of the present invention includes a data multiplexer 120, an ODT calibration circuit 140, and an output circuit 160.

The data multiplexer 120 selectively receives an input data RDO (data synchronized at a rising edge of a clock) and an input data FDO (data synchronized at a falling edge of the clock) in response to clock signals RCLKDO (rising clock) and FCLKDO (falling clock) to output pull-up and pull-down data signals UP and DN.

The on-die termination (ODT) calibration circuit 140 performs an impedance calibration operation in proportion to a reference resistance/impedance to output pull-up and pull-down resistance-adjusting code signals PCODE<0:4> and NCODE<0:4>.

The output circuit 160 receives the pull-up and pull-down data signals UP and DN, the pull-up and pull-down resistance-adjusting code signals PCODE<0:4> and NCODE<0:4>, and an enable signal EN<0:7> to generate pull-up and pull-down control signals, which are not shown in FIG. 1.

Further, the output circuit 160 selectively drives one or more pull-up and pull-down drivers to output a data output signal DQ.

The pull-up and pull-down resistance-adjusting code signals PCODE<0:4> and NCODE<0:4> and the enable signal EN<0:7> are static signals, which means a predetermined value of PCODE<0:4>, NCODE<0:4> and EN<0:7>, whereas the pull-up and pull-down data signals UP and DN are signals which are toggled in response to a data signal.

Figure 2:
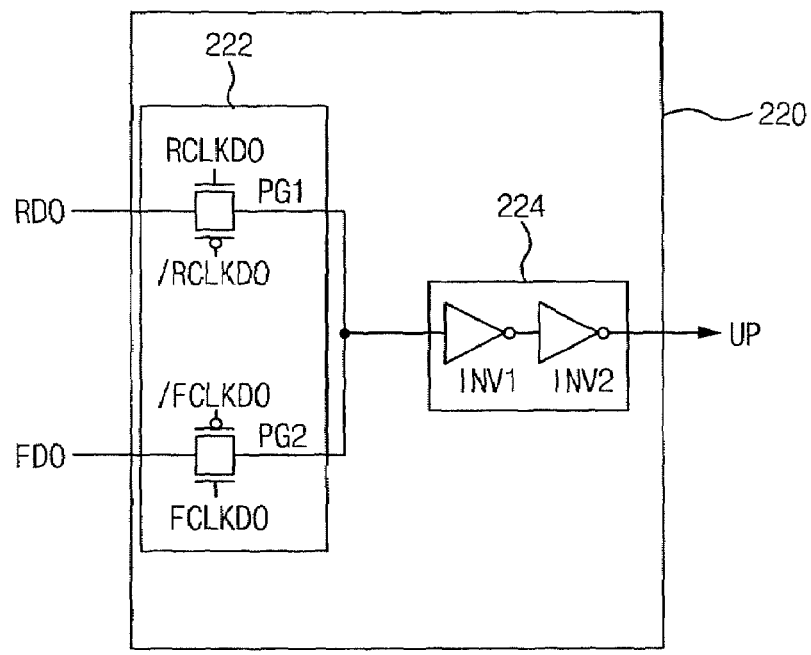
FIG. 2 is a circuit diagram of a data multiplexer illustrated in FIG. 1.
Figure 2:
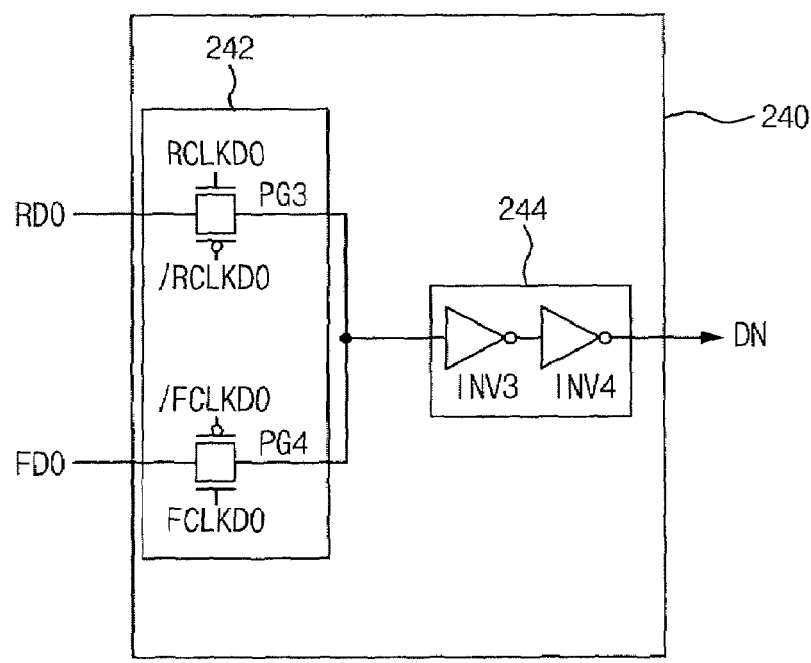

Referring to FIG. 2, the data multiplexer 120 shown in FIG. 1 includes first and second multiplexers 220 and 240, which selectively output the pull-up and pull-down data signals UP and DN. The first multiplexer 220 includes a selector 222 and an output buffer 224. The selector 222 includes a passgate PG1, which selectively outputs the input data signal, RDO, in response to the clock signal RCLKDO and a passgate PG2, which selectively outputs the input data FDO in response to the clock signal FCLKDO. The passgate PG1 and the passgate PG2 have a commonly connected output stage.

The output buffer 224 includes invertors INV1 and INV2. The output buffer 224 receives the signal output from the selector 222 and outputs the pull-up data signal, UP.

The second multiplexer 240 includes a selector 242 and an output buffer 244. Since the structures and operations of the selector 242 and the output buffer 224 are the same as those of the output buffer 224, description of the second multiplexor 240 is omitted for brevity.

Figure 3:
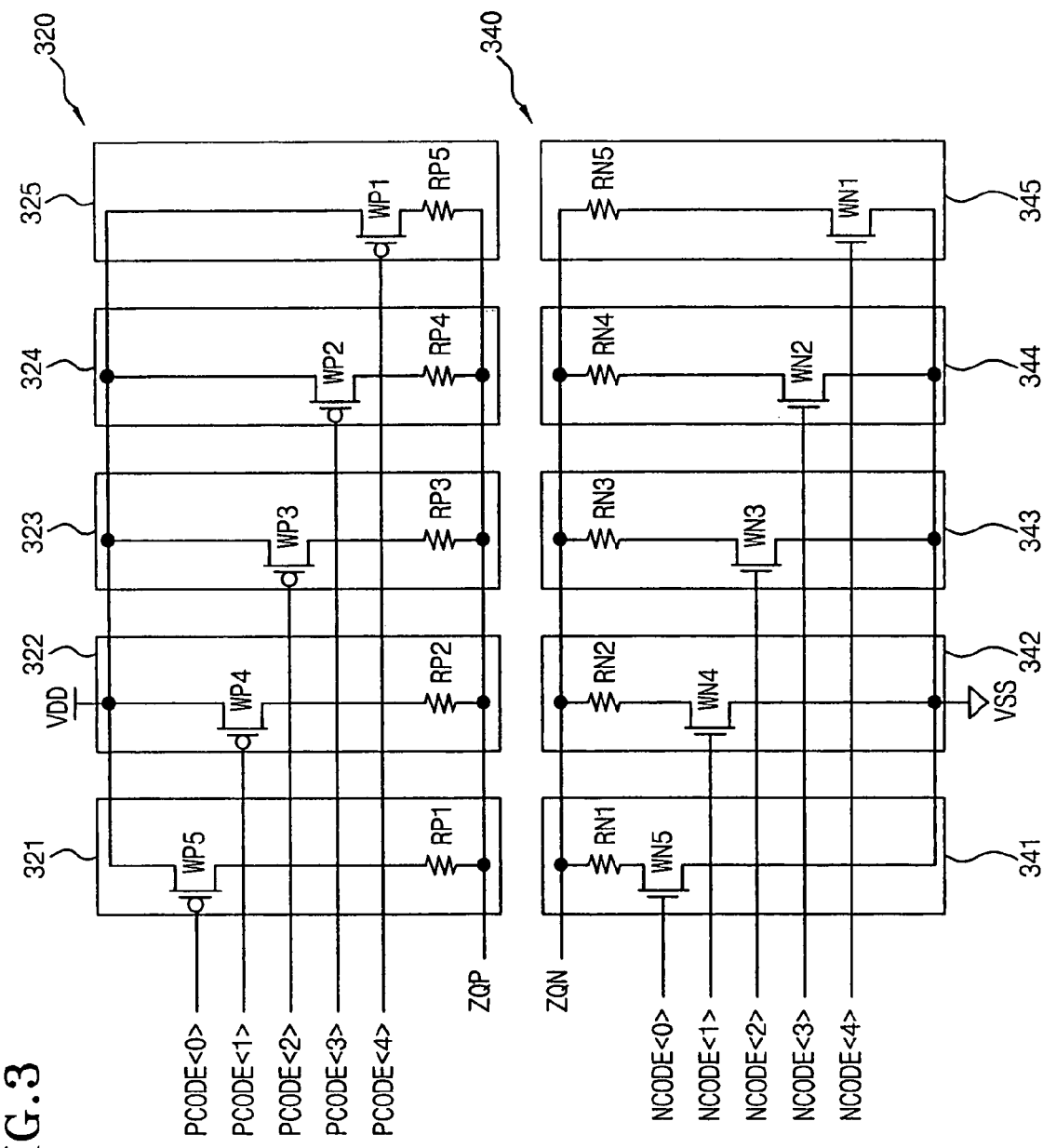
FIG. 3 is a circuit diagram of pull-up and pull-down calibration drivers of an on-die termination illustrated in FIG. 1.

Referring to FIG. 3, a pull-up calibration driver 320 of the ODT calibration circuit includes a plurality of "fingers" identified by reference numerals 321 to 325. Each "finger" 321, 322, 323, 324 and 325 includes a PMOS transistor connected in series with a resistor. The separate "fingers" 321, 322, 323, 324 and 325 are connected in parallel to each other, between a power node or stage VDD, and a node ZQP.

A pull-down calibration driver 340 includes a plurality of "fingers" 341 to 345 connected in parallel between a ground stage VSS and a node ZQN. Each finger of the calibration driver 340 uses an NMOS transistor in series with a resistor.

In one embodiment, the reference resistance/impedance is set to 240Ω and five "fingers" are used. Then, impedances of the pull-up and pull-down calibration drivers 320 and 340 are calibrated in response to the pull-up and pull-down resistance-adjusting code signals PCODE<0:4> and NCODE<0:4>. The reference resistance/impedance and the number of fingers, however, may vary as a design choice.

In practice, the pull-up calibration driver 320 and the pull-down calibration driver 340 respectively have the same structures as a pull-up driver and a pull-down driver constituting an output driver circuit of an output circuit to be described later. The pull-up driver and the pull-down driver respectively receive the pull-up and pull-down resistance-adjusting code signals PCODE<0:4> and NCODE<0:4> to match the impedance of the output circuit 160 to the reference resistance/impedance.

The fingers 321 to 325 constituting the pull-up calibration driver 320 respectively include: PMOS transistors WP5, WP4, WP3, WP2, and WP1 connected in series between the power stage VDD and the node ZQP; and resistors RP1, RP2, RP3, RP4, and RP5. Those of ordinary skill will recognize that after making appropriate circuit topology revisions, NMOS transistors could be used instead.

Here, the PMOS transistors WP5, WP4, WP3, WP2, and WP1 are controlled by each bit of the pull-up resistance-adjusting code signal PCODE<0:4>, and a resistance of each of the resistors RP1, RP2, RP3, RP4, and RP5 is determined by using the following Formula.

$$RP2=2RP1, RP3=4RP1, \ldots, RPN=2^{N-1}RP1 \quad \text{[Formula 1]}$$

A channel length of the PMOS transistor WP5 connected in series with the resistor RP1 is significantly greater than those of the PMOS transistors WP4, WP3, WP2, and WP1. Thus, the pull-up resistance-adjusting code signal PCODE<0> is output from the finger 321 including the PMOS transistor WP5 and has the greatest load. Accordingly, the finger 321 becomes a most significant bit (hereinafter, referred to as an MSB).

The fingers 341 to 345 constituting the pull-down calibration driver 340 respectively include: resistors RN1, RN2, RN3, RN4, and RN5 connected in series between the ground stage VSS and a node ZQN and NMOS transistors WN5, WN4, WN3, WN2, and WN1.

Here, the NMOS transistors WN5, WN4, WN3, WN2, and WN1 are controlled by each bit of the pull-down resistance-adjusting code signal NCODE<0:4>, and a resistance of each of the resistors RN1, RN2, RN3, RN4, and RN5 is determined by using the following Formula. Those of ordinary skill will also recognize that PMOS transistors might be used instead after making appropriate circuit topology changes.

$$RN2=2RN1, RN3=4RN1, \ldots, RNN=2^{N-1}RN1 \quad \text{[Formula 2]}$$

A channel length of the NMOS transistor WN5 connected in series with the resistor RN1 is significantly greater than those of the NMOS transistors WN4, WN3, WN2, and WN1. Thus, the pull-down resistance-adjusting code signal NCODE<0> is output from the finger 341 including the NMOS transistor WN5 and has the greatest load. Accordingly, the finger 341 becomes an MSB.

The pull-up calibration driver 320 increases an impedance between the power stage VDD and the node ZQP by increasing the pull-up resistance-adjusting code signal PCODE<0:4> and decreases an impedance between the power stage VDD and a node ZQP by decreasing the pull-up resistance-adjusting code signal PCODE<0:4>.

On the other hand, the pull-up calibration driver 340 decreases an output voltage of the node ZQN by increasing the pull-down resistance-adjusting code signal NCODE<0:4> and increases an output voltage of the node ZQN by decreasing the pull-down resistance-adjusting code signal NCODE<0:4>.

The nodes ZQP and ZQN are commonly connected.

Figure 4:
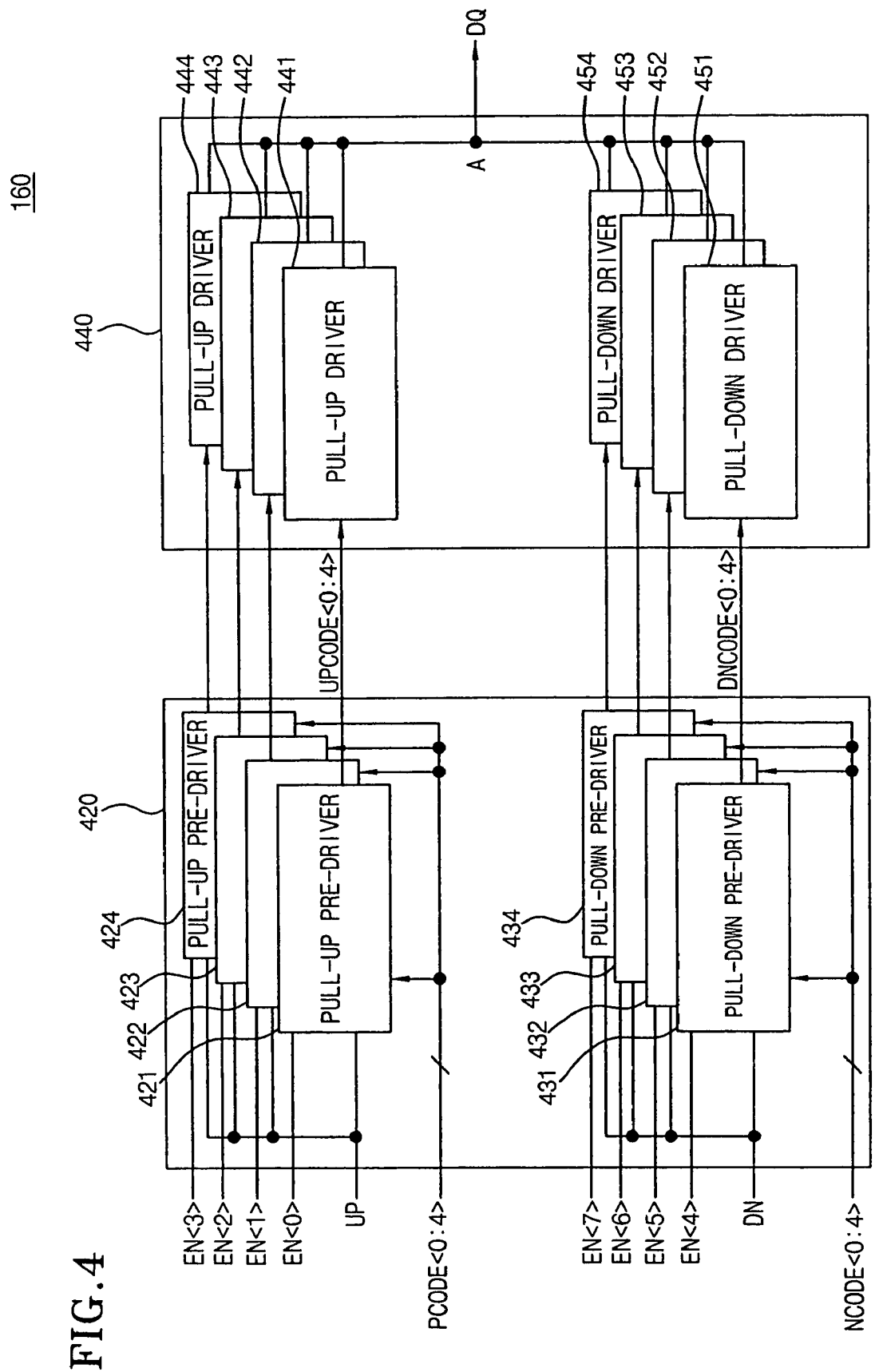
FIG. 4 is a block diagram of an output circuit illustrated in FIG. 1.

Referring to FIG. 4, the output circuit 160 shown in FIG. 1 includes a pre-driver circuit 420 and an output driver circuit 440. The pre-driver circuit 420 includes pull-up pre-drivers 421 to 424 which logic-combine the pull-up data signal UN, the enable signal EN<0:4>, and the pull-up resistance-adjusting code signal PCODE<0:4> to output the pull-up control signal UPCODE<0:4>; and pull-down pre-drivers 431 to 434 which logic-combine the pull-down data signal DN, the enable signal EN<4:7>, and the pull-down resistance-adjusting code signal NCODE<0:4> to output the pull-down control signal DNCODE<0:4>.

Each of the pull-up pre-drivers 421 to 424 includes pull-up control signal generators (not shown) which generate the pull-up control signal UPCODE<0:4>. Each of the pull-down pre-drivers 431 to 434 includes pull-down control signal generators (not shown) which generate the pull-down control signal DNCODE<0:4>.

In the output driver circuit 440, if the reference resistance/impedance is 240Ω, in order to match the impedance of the data output signal DQ, an output node A is connected in parallel with pull-up drivers 441, 442, 443 and 444, the impedances of which are factors of 240Ω (e.g., a pull-up driver 441 of 60Ω, a pull-up driver 442 of 120Ω, and pull-up drivers 443 and 444 of 240Ω) and pull-down drivers 451, 452, 453 and 454, the impedances of which are factors of 240Ω (e.g., a pull-down driver 451 of 60Ω, a pull-down driver 452 of 120Ω, and pull-down drivers 453 and 454 of 240Ω).

As described above, each of the pull-up drivers 441 to 444 has the same structure as the pull-up calibration driver 320 (shown in FIG. 3). Each of the pull-down drivers 451 to 454 has the same structure as the pull-down calibration driver 340 (shown in FIG. 3).

Therefore, each of the pull-up drivers 441 to 444 includes five fingers in which PMOS transistors and resistors are connected in series. Each of the pull-up drivers 441 to 444 is selectively driven in response to the pull-up control signal UPCODE<0:4> to adjust the impedance of the data output signal DQ. Likewise, each of the pull-down drivers 451 to 454 includes five fingers in which NMOS transistors and resistors are connected in series. Further, each of the pull-down drivers 451 to 454 is selectively driven in response to the pull-down control signal DNCODE<0:4> to adjust the impedance of the data output signal DQ.

Figure 5A:
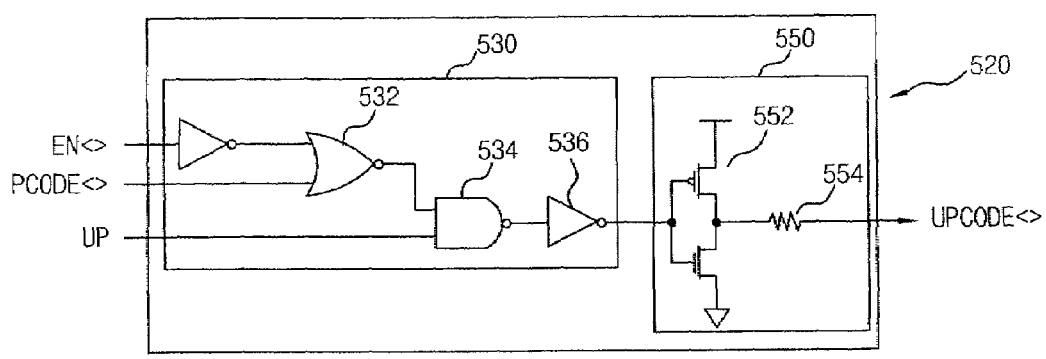
FIG. 5a is a circuit diagram of a pull-up control signal generator included in a pull-up pre-driver illustrated in FIG. 4.

Referring to FIG. 5A, a pull-up control signal generator 520 of each pull-up pre-driver shown in FIG. 4 includes a driving element 530 which logic-combines the enable signal EN< >, the pull-up resistance-adjusting code signal PCODE< >, and the pull-up data signal UP to generate a pull-up driving signal; and an output element 550 which receives the pull-up driving signal to output the pull-up control signal UPCODE< >.

The driving element 530 of the pull-up control signal generator 520 includes: a NOR gate 532 which NOR-combines the inverted enable signal EN< > and the pull-up resistance-adjusting code signal PCODE< >; a NAND gate 534 which NAND-combines an output signal of the NOR gate 532 and the pull-up data signal UP; and an inverter 536 which inverts an output signal of the NAND gate 534 to output a pull-up driving signal.

The output element 550 of the pull-up control signal generator 520 includes: a CMOS inverter 552 which inverts the pull-up driving signal; and a resistor 554 which outputs the pull-up control signal UPCODE< > while reducing influence on an output of the CMOS inverter 552 dependent on a process and a voltage. Each of the pull-up pre-drivers 421 to 424 (shown in FIG. 4) includes pull-up control signal generators 520 as many as the number of bits (in this case, five) of the pull-up control signal UPCODE< >.

When the enable signal EN< > is in a high level, and the pull-up resistance-adjusting code signal PCODE< > is in the low level, the pull-up control signal generators 520 output the pull-up control signal UPCODE< > in response to the pull-up data signal UP. On the other hand, when the enable signal EN< > is in the low level, or the pull-up resistance-adjusting code signal PCODE< > is in the high level, the pull-up control signal UPCODE< > is fixed to high level irrespective of the pull-up data signal UP. As a result, a corresponding pull-up driver cannot be driven.

Figure 5B:
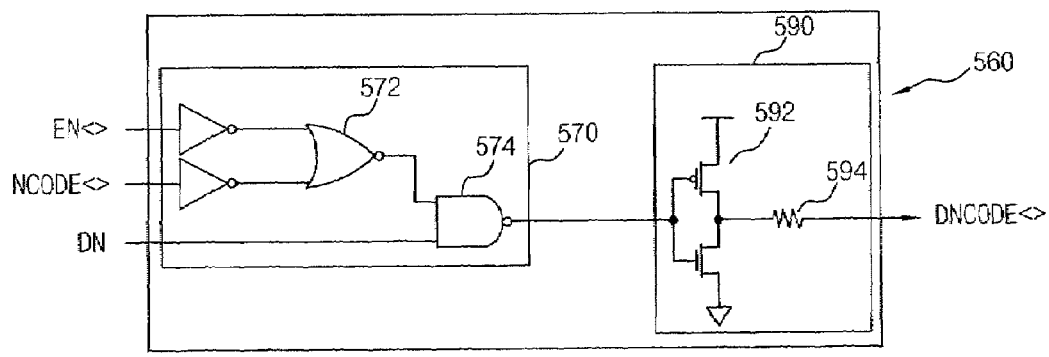
FIG. 5b is a circuit diagram of a pull-down control signal generator included in a pull-down pre-driver illustrated in FIG. 4.

Referring to FIG. 5B, a pull-down control signal generator 560 of each FIG. 4 pull-down pre-driver includes: a driving element 570 which logic-combines the enable signal EN< >, the pull-down resistance-adjusting code signal NCODE< >, and the pull-down data signal DN to generate a pull-down driving signal; and an output element 590 which receives the pull-down driving signal to output the pull-down control signal DNCODE< >.

The driving element 570 of the pull-down control signal generator 560 includes: a NOR gate 572 which NOR-combines the inverted enable signal EN< > and the inverted pull-down resistance-adjusting code signal NCODE< >; and a NAND gate 570 which NAND-combines an output signal of the NOR gate 572 and the pull-down data signal DN to output a pull-down driving signal.

The output element 590 of the pull-down control signal generator 560 includes: a CMOS inverter 592 which inverts the pull-down driving signal; and a resistor 594 which outputs the pull-down control signal DNCODE< > while reducing influence on an output of the CMOS inverter 592 dependent on a process and a voltage.

Each of the pull-down pre-drivers 431 to 434 (shown in FIG. 4) includes pull-down control signal generators 560 as many as the number of bits (in this case, five) of the pull-down control signal DNCODE< >.

The pull-down control signal generators 560 operate such that, when the enable signal EN< > and the pull-down resistance-adjusting code signal NCODE< > are in the high level, the pull-down control signal generators 560 outputs the pull-down control signal DNCODE< > in response to the pull-down data signal DN. On the other hand, when the enable signal EN< > or the pull-down resistance-adjusting code signal NCODE< > is in the low level, the pull-down control signal DNCODE< > is fixed to the low level irrespective of the pull-down data signal DN. As a result, a corresponding pull-down driver cannot be driven.

As described above, in the first embodiment of the present invention, a NOR gate having a large load is excluded on the path through which the pull-up and pull-down data signals UP and DN are rapidly generated. Instead, the pre-driver circuit is constructed with a NAND-gate. Therefore, output skews of the pull-up and pull-down control signals UPCODE< > and DNCODE< > are reduced, thereby decreasing the skew of the data output signal.

Figure 6:
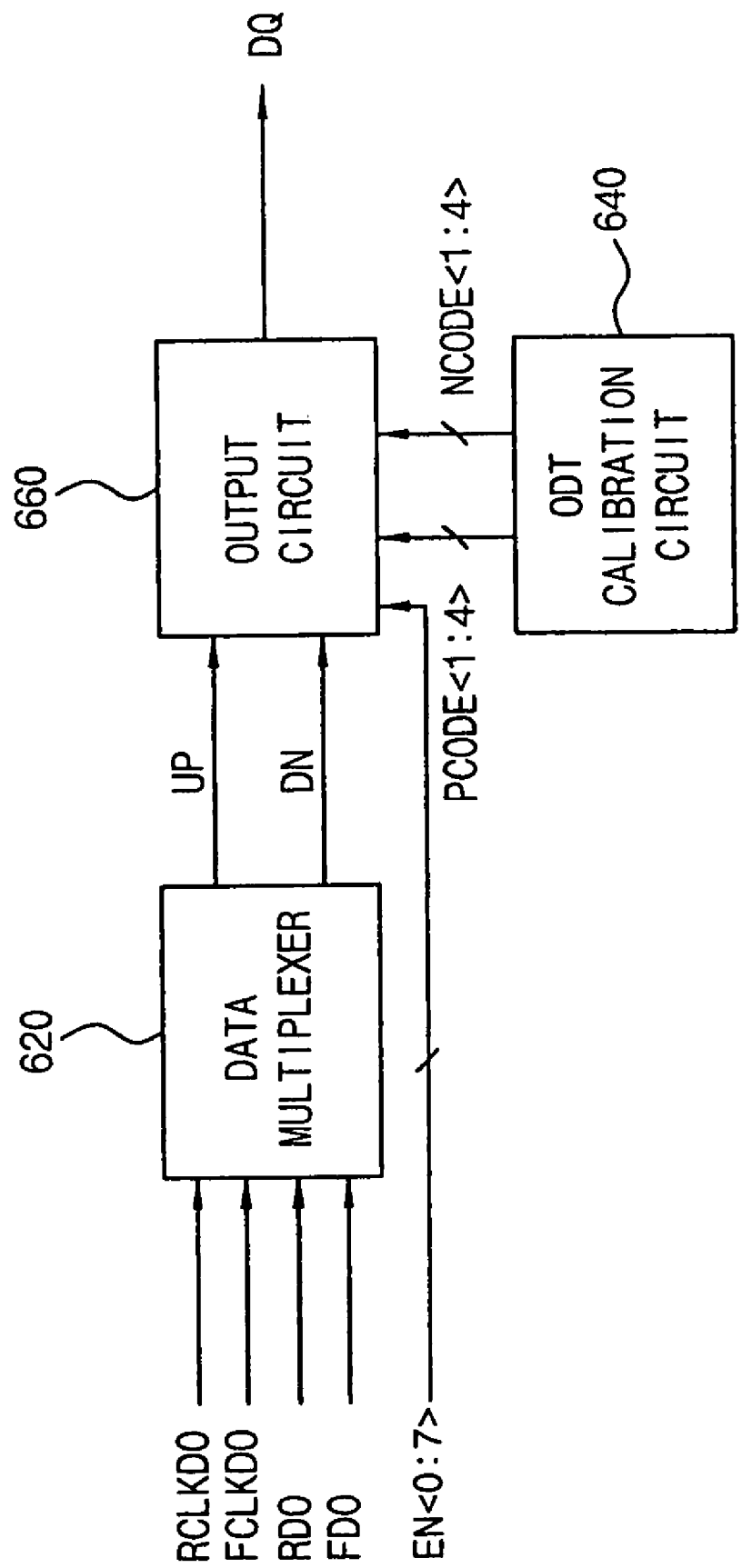
FIG. 6 is a block diagram of a data output driver according to a second embodiment of the present invention.

Referring to FIG. 6, a data output driver according to a second embodiment of the present invention includes a data multiplexer 620, an ODT calibration circuit 640, and an output circuit 660. The data multiplexer 620 has the same structure and operation as the data multiplexer (FIG. 2) of the first embodiment. Thus, additional descriptions thereof will be omitted. The data multiplexer 620 supplies the pull-up and pull-down data signals UP and DN to the output circuit 660.

The structure and operation of the ODT calibration circuit 640 are similar to those of the ODT calibration circuit 160 illustrated in FIG. 1 according to the first embodiment of the present invention. However, the pull-up and pull-down resistance-adjusting code signals PCODE<0> and NCODE<0> corresponding to the MSB are always enabled, so that the number of bits of the pull-up and pull-down resistance-adjusting code signals PCODE<1:4> and NCODE<1:4> supplied to the output circuit 660 is reduced to be 4-bit.

The structure and operation of the output circuit 660 are similar to those of the output circuit (FIG. 4) according to the first embodiment of the present invention. In the first embodiment, the pull-up and pull-down control signal generators (FIGS. 5A and 5B) of each of the pull-up and pull-down pre-drivers have the same structure. However, in the second embodiment, a plurality of pull-up and pull-down control signal generators of each of pull-up and pull-down pre-drivers have at least one different structure.

That is, in the pull-up pre-drivers of the second embodiment, the ODT calibration circuit 640 allows the pull-up and pull-down resistance-adjusting code signals PCODE<0> and NCODE<0> to be always enabled. Therefore, the pull-up pre-driver is constructed with a first pull-up control signal generator receiving the pull-up resistance-adjusting code signal PCODE< > and a second pull-up control signal generator not receiving the pull-up resistance-adjusting code signal PCODE< >. Likewise, the pull-down pre-driver of the second embodiment is constructed with a first pull-down control signal generator receiving the pull-down resistance-adjusting code signal NCODE< > and a second pull-down control signal generator not receiving the pull-down resistance-adjusting code signal NCODE< >.

The first pull-up and pull-down control signal generators have the same structure and operation as the pull-up and pull-down control signal generates (FIGS. 5A and 5B) of the first embodiment.

Figure 7:
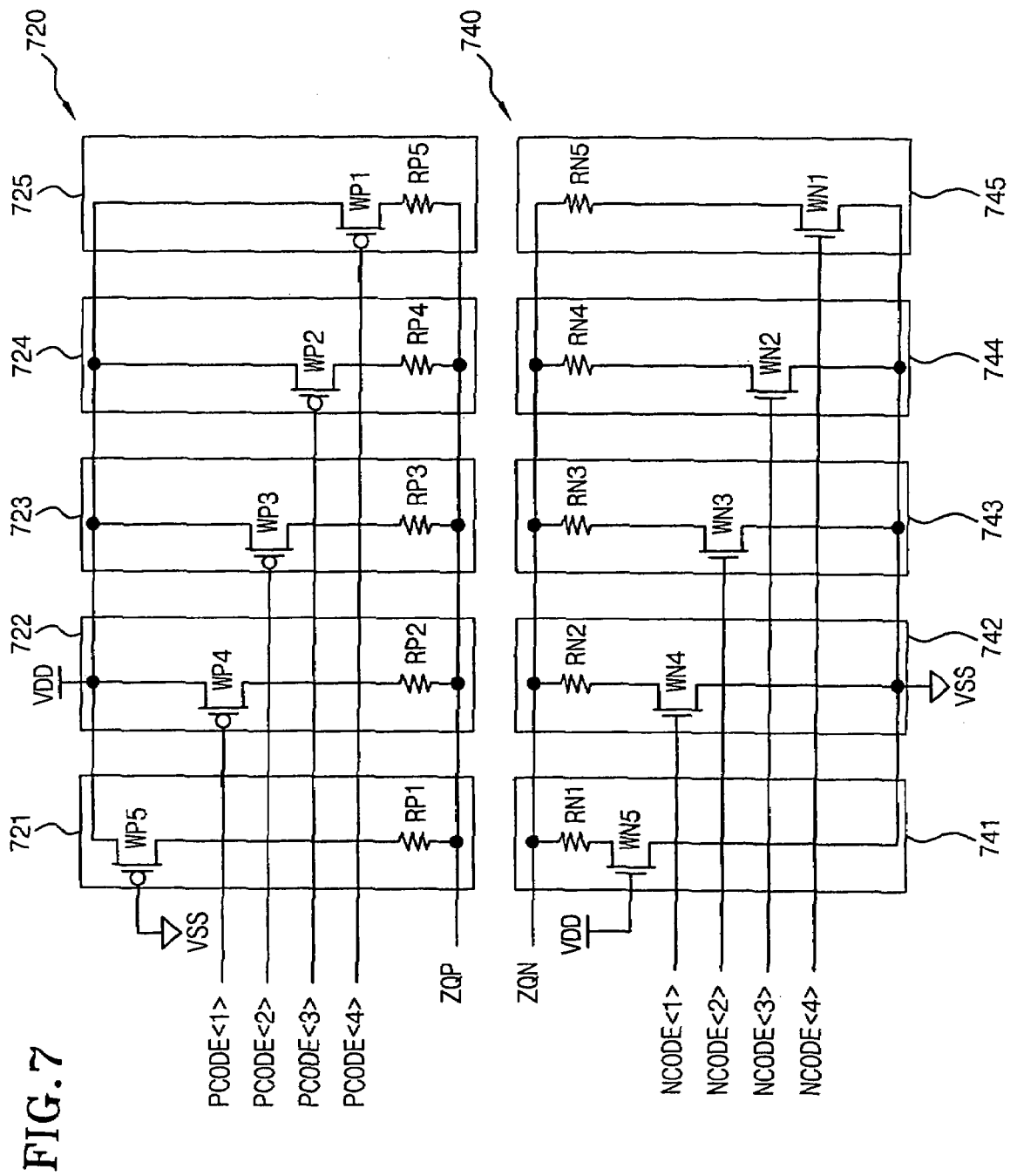
FIG. 7 is a circuit diagram of pull-up and pull-down calibration drivers of an on-die termination illustrated in FIG. 6.

Referring to FIG. 7, a pull-up calibration driver 720 of the ODT calibration circuit includes a plurality of fingers 721 to 725 connected in parallel between the power stage VDD and the node ZQP. A pull-down calibration driver 740 includes a plurality of fingers 741 to 745 connected in parallel between the ground stage VSS and the node ZQN.

In the second embodiment of the present invention, the finger 721 corresponding to the MSB among the fingers 721 to 725 constituting the pull-up calibration driver 720 and the finger 741 corresponding to the MSB among the fingers 741 to 745 constituting the pull-down calibration driver 740 have great strengths and thus are not used in an ODT calibration process performing fine tuning. Therefore, the ground voltage VSS is supplied to the gate of the PMOS transistor WP5, and the power voltage VDD is supplied to the gate of the NMOS transistor WN5, so that they can be always turned on. Accordingly, corresponding pull-up and pull-down resistance-adjusting code signals PCODE<0> and NCODE<0> are reduced to output the 4-bit pull-up and pull-down resistance-adjusting code signals PCODE<1:4> and NCODE<1:4>.

Figure 8A:
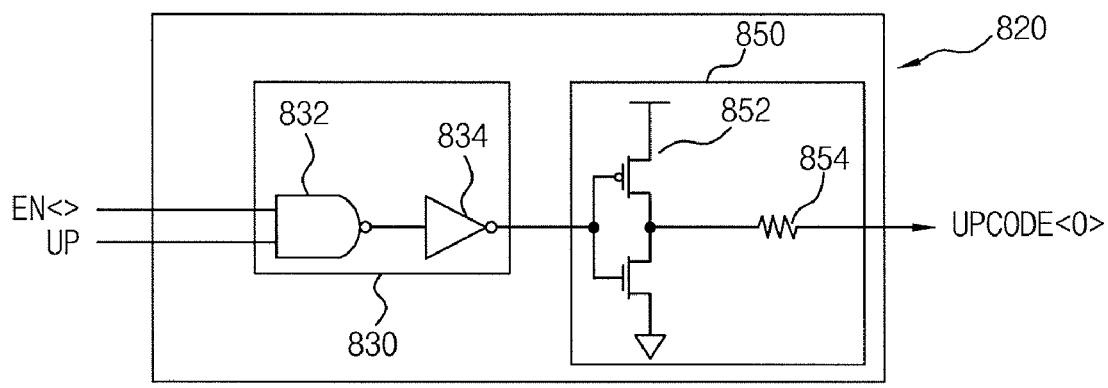
FIG. 8a is a circuit diagram of a pull-up control signal generator included in a pull-up pre-driver of an output circuit illustrated in FIG. 6.

Referring to FIG. 8A, a second pull-up control signal generator 820 of each pull-up pre-driver includes: a driving element 830 which logic-combines the enable signal EN< > and the pull-up data signal UP to generate a pull-up driving signal; and an output element 850 which receives the pull-up driving signal to output the pull-up controls signal UPCODE< >.

The driving element 830 includes: a NAND gate 832 and an inverter 834. The NAND gate 832 NAND-combines the enable signal EN< > and the pull-up data signal UP. The inverter 834 inverts the output signal of the NAND gate 832 to output a pull-up driving signal.

The output element 850 includes: a CMOS inverter 852 which inverts the pull-up driving signal; and a resistor 854 which outputs the pull-up control signal UPCODE< > while reducing influence on an output of the CMOS inverter 852 dependent on a process and a voltage.

The second pull-up control signal generator 820 operates such that, when the enable signal EN< > is in the high level, the pull-up control signal UPCODE< > is output in response to the pull-up data signal UP. On the other hand, when the enable signal EN< > is in the low level, the pull-up control signal UPCODE< > is fixed to the high level irrespective of the pull-up data signal UP. As a result, a corresponding pull-up driver cannot be driven.

Figure 8B:
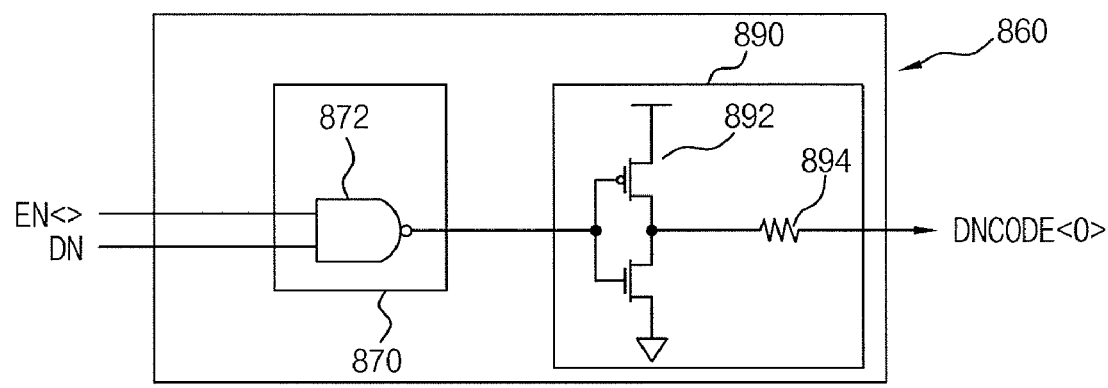
FIG. 8b is a circuit diagram of a pull-down control signal generator included in a pull-down pre-driver of an output circuit illustrated in FIG. 6.

Referring to FIG. 8B, a second pull-down control signal generator 860 of each pull-down pre-driver includes a driving element 870, which logic-combines the enable signal EN< > and the pull-down data signal DN to generate a pull-down driving signal; and an output element 890 which receives the pull-down driving signal to output the pull-down control signal DNCODE< >.

The driving element 870 includes a NAND gate 872 which NAND-combines the enable signal EN< > and the pull-down data signal DN.

The output element 890 has the same structure and operation as the output element 850 of the second pull-up control signal generator. Thus, additional descriptions thereof will be omitted.

The second pull-up control signal generator 860 operates such that, when the enable signal EN< > is in the high level, the pull-down control signal DNCODE< > is output in response to the pull-down data signal DN. On the other hand, when the enable signal EN< > is in the low level, the pull-down control signal DNCODE< > is fixed to the high level irrespective of the pull-down data signal DN. As a result, a corresponding pull-up driver cannot be driven.

According to the second embodiment of the present invention, the number of bits of the pull-up and pull-down resistance-adjusting code signals PCODE< > and NCODE< > output from the ODT calibration circuit is reduced, and the pull-up and pull-down control signals UPCODE<0> and DNCODE<0> are generated by the second pull-up and pull-down control signal generators of the respective pull-up and pull-down pre-drivers without having to use the pull-up and pull-down resistance-adjusting code signals PCODE< > and NCODE< >. Thus, the number of elements are reduced while reducing the skew of the data output signal. As a result, it is possible to provide a data output driver suitable for low power.

Figure 9:
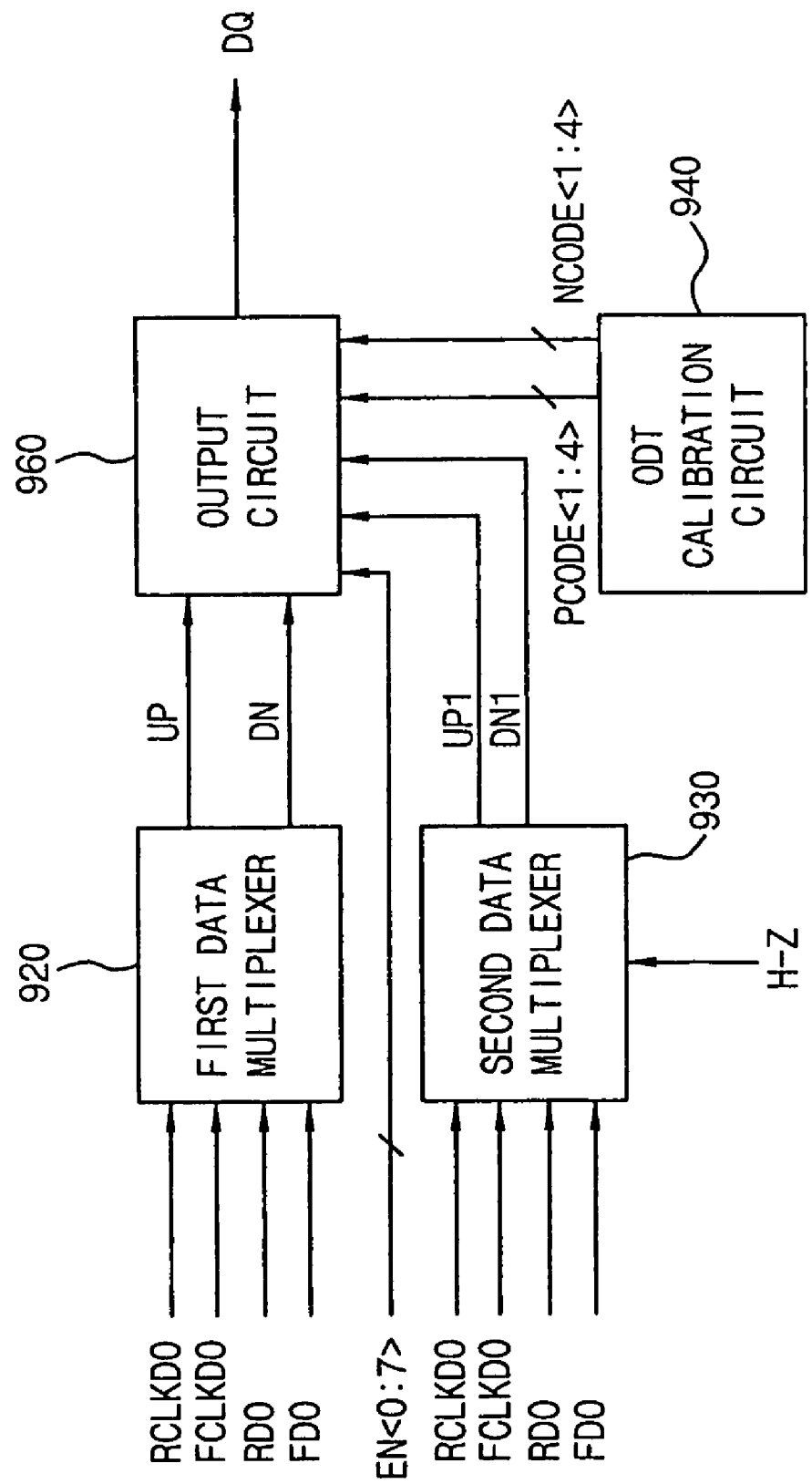
FIG. 9 is a block diagram of a data output driver according to a third embodiment of the present invention.

Referring to FIG. 9, a data output driver according to a third embodiment of the present invention includes a first multiplexer 920, a second data multiplexer 930, an ODT calibration circuit 940, and an output circuit 960.

The first data multiplexer 920 has the same structure and operation as the data multiplexer (FIG. 6) of the second embodiment. Thus, additional descriptions thereof will be omitted. The first data multiplexer 920 supplies the pull-up and pull-down data signals UP and DN to the output circuit 960.

The second data multiplexer 930 receives the input data signals RDO and FDO to output pull-up and pull-down data signals UP1 and DN1 in response to a high impedance signal H-Z generated in response to the clock signals RCLKDO, FCLKDO, and EMRS. Therefore, specific pull-up and pull-down pre-drivers receiving the pull-up and pull-down data signals UP1 and DN1 output the pull-up and pull-down control signals UPCODE< > and DNCODE< > without having to use the enable signal EN< >.

The ODT calibration circuit 940 has the same structure and operation as the ODT calibration circuit 640 of the second embodiment. Thus, additional descriptions thereof will be omitted. The ODT calibration circuit 940 supplies the 4-bit pull-up and pull-down resistance-adjusting code signals PCODE<1:4> and NCODE<1:4> to the output circuit 960.

Similar to the output circuit 660 of the second embodiment, the output circuit 960 includes a pre-driver circuit and an output driver circuit.

The pre-driver circuit includes: first pull-up and pull-down pre-drivers which receive the pull-up and pull-down data signals UP and DN to output the pull-up and pull-down control signals UPCODE< > and DNCODE< >; and second pull-up and pull-down pre-drivers which receive the pull-up and pull-down data signals UP1 and UP2 to output the pull-up and pull-down control signals UPCODE< > and DNCODE< >.

Here, the first pull-up and pull-down pre-drivers have the same structures and operations as the pull-up and pull-down pre-drivers of the second embodiment. However, the structures of the second pull-up and pull-down pre-drivers are simpler than those of the first pull-up and pull-down pre-drivers since the enable signal EN< > is not supplied thereto.

As described in the second embodiment, the first pull-up and pull-down pre-drivers and the second pull-up and pull-down pre-drivers are respectively constructed with the first pull-up and pull-down control signal generators receiving the pull-up and pull-down resistance-adjusting code signals PCODE< > and NCODE< > and the second pull-up and pull-down control signal generators not receiving the pull-up and pull-down resistance-adjusting code signals PCODE< > and NCODE< >.

As descried in the first embodiment, the output driver circuit 440 (shown in FIG. 4) is constructed with pull-up drivers and pull-down drivers. These drivers have different loads according to a resistance/impedance. For example, when resistance/impedances of 60Ω, 120Ω, and 240 Ω are used, pull-up and pull-down drivers having the smallest impedance (here, 60Ω) have significantly greater loads than other pull-up and pull-down drivers. The skew of the data output signal can be improved by reducing the skew of a signal output from pull-up and pull-down drivers having the greatest load. Therefore, the pull-up and pull-down data signals UP1 and DN1 are preferably supplied to the pull-up and pull-down pre-drivers which drive the pull-up and pull-down drivers having impedances of 60Ω.

Figure 10:
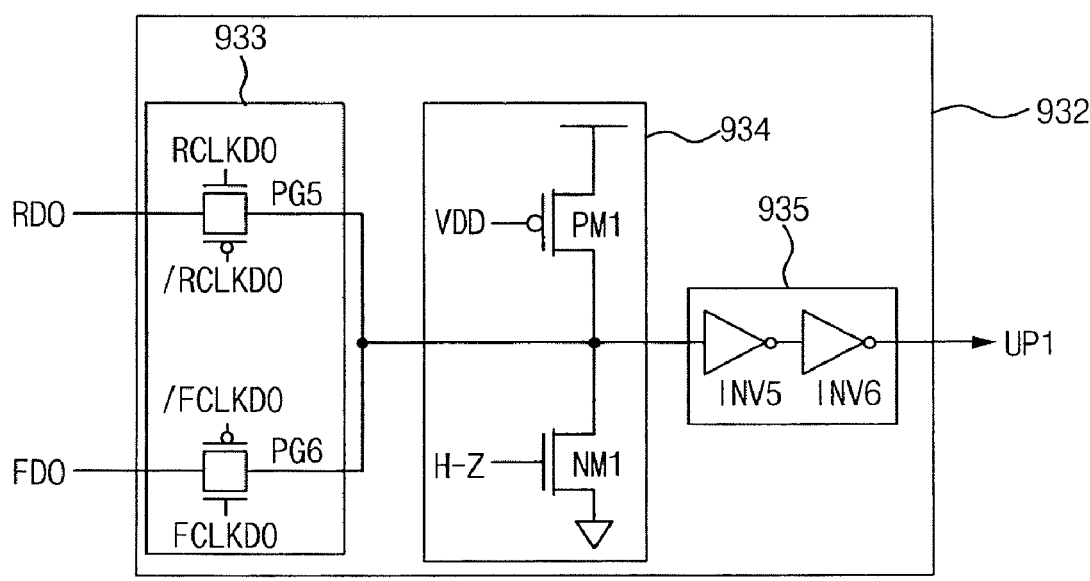
FIG. 10 is a circuit diagram of a second data multiplexer illustrated in FIG. 9.
Figure 10:
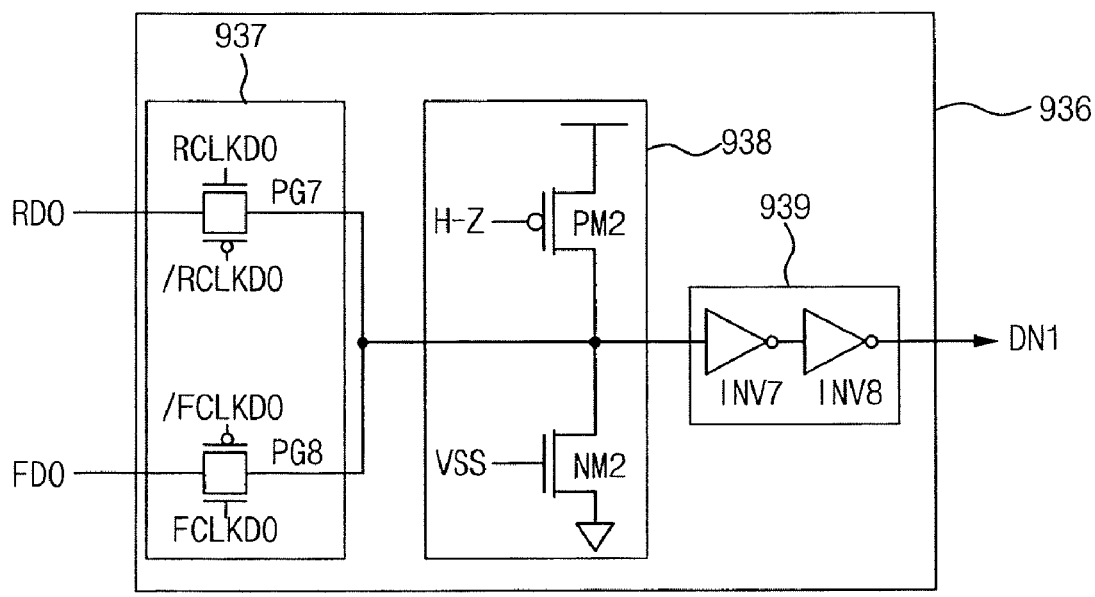

Referring to FIG. 10, the second data multiplexer 930 includes a first multiplexer 932, which outputs the pull-up data signal UP1 and a second multiplexer 936, which outputs the pull-down data signal DN1.

The first multiplexer 932 includes a selector 933, a switch 934, and an output buffer 935.

The selector 933 includes a passgate PG5, which selectively outputs the output data RDO in response to the clock signal RCLKDO and a passgate PG6, which selectively outputs the input data FDO in response to the clock signal FCLKDO. Here, the passgate PG5 and the passgate PG6 have a commonly connected output stage.

In the switch 934, a PMOS transistor PM1 and an NMOS transistor NM1 are connected in series between the power stage VDD and the ground stage VSS, and a common drain stage thereof is connected to an output stage of the selector 933. Further, the power voltage VDD is supplied to the gate of the PMOS transistor PM1, and the high impedance signal H-Z is supplied to the gate of the NMOS transistor NM1.

The output buffer 935 includes invertors INV5 and INV6 and receives an output of the switch 934 to output the pull-up data signal UP1.

The second multiplexer 936 has a structure similar to that of the first multiplexer 932. However, the high impedance signal H-Z is supplied to the gate of a PMOS transistor PM2, and the ground voltage VSS is supplied to the gate of an NMOS transistor NM2.

The second data multiplexer 930 operates such that, when the high impedance signal H-Z is in the high level, the pull-up data signal UP1 is output in the low level irrespective of the input data signal RDO or FDO, and the pull-down data signal DN1 is output in response to the input data signal RDO or FDO. On the other hand, when the high impedance signal H-Z is in the low level, the pull-up data signal UP1 is output in response to the input data signal RDO or FDO, and the pull-down data signal DN1 is output in the high level irrespective of the input data signal RDO or FDO.

Figure 11A:
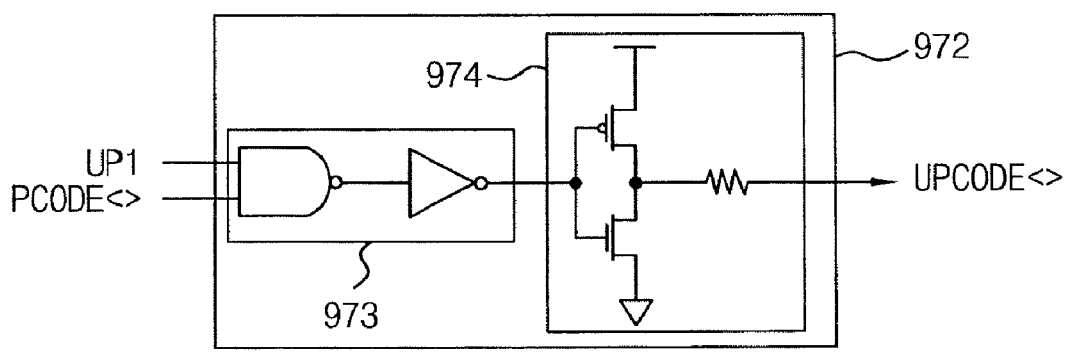
FIG. 11a is a circuit diagram of a first pull-up control signal generator included in a first pull-up pre-driver of an output circuit illustrated in FIG. 9.

Referring to FIG. 11A, a first pull-up control signal generator 972 of the first pull-up pre-driver includes: a driving element 973 which receives the pull-up data signal UP1 and the pull-up resistance-adjusting code signal PCODE< > to generate a pull-up driving signal; and an output element 974 which receives the pull-up driving signal to output the pull-up control signal UPCODE< >.

Here, the driving element 973 may include: a NAND gate which NAND-gates the pull-up data signal UP1 and the pull-up resistance-adjusting code signal PCODE< >; and an inverter which inverts the resultant signal. The output element 974 may include: a CMOS inverter, which inverts the pull-up driving signal; and a resistor.

Figure 11B:
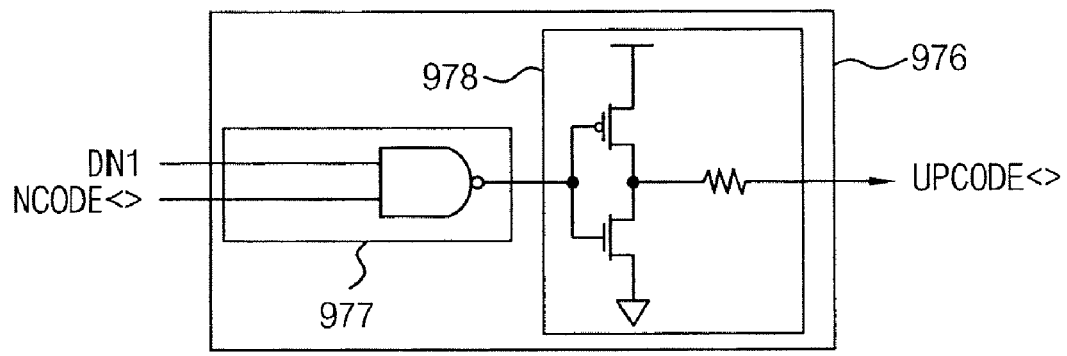
FIG. 11b is a circuit diagram of a first pull-down control signal generator included in a first pull-down pre-driver of an output circuit illustrated in FIG. 9.

Referring to FIG. 11B, a first pull-down control signal generator 976 of the first pull-down pre-driver has the same structure and operation as the first pull-up control signal generator 972. Thus, additional description thereof will be omitted. The first pull-down control signal generator 976 receives the pull-down data signal DN1 and the pull-down resistance-adjusting code signal NCODE< > to output the pull-down control signal DNCODE< >.

Figure 12A:
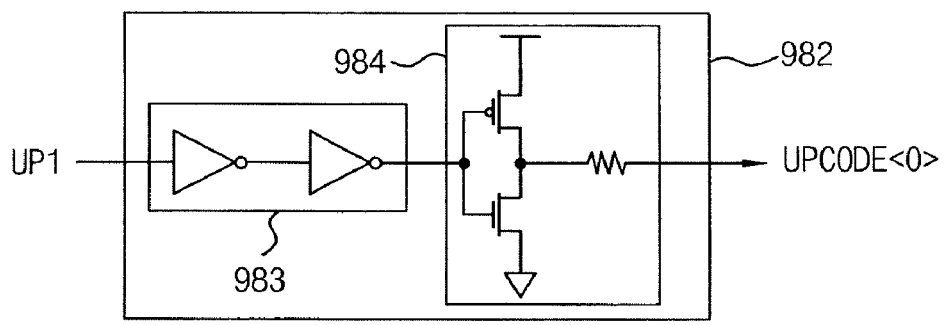
FIG. 12a is a circuit diagram of a second pull-up control signal generator included in a second pull-up pre-driver of an output circuit illustrated in FIG. 9.

Referring to FIG. 12A, the second pull-up control signal generator 982 of the second pull-up pre-driver includes: a driving element 983 which receives the pull-up data signal UP to generate a pull-up driving signal; and an output element 984 which receives the pull-up driving signal to output the pull-up control signal UPCODE< >.

Here, the driving element 983 may include the even number of inverters transmitting the pull-up data signal UP1. The output element 984 may include: a CMOS inverters which inverts the pull-up driving signal; and a resistor.

Figure 12B:
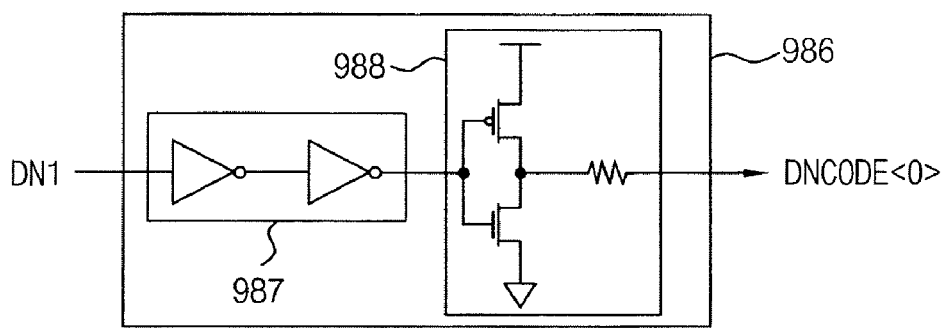
FIG. 12b is a circuit diagram of a second pull-down control signal generator included in a second pull-down pre-driver of an output circuit illustrated in FIG. 9.

Referring to FIG. 12B, a second pull-down control signal generator 986 of the second pull-down pre-driver has the same structure and operation as the second pull-up control signal generator 982. Thus, additional descriptions thereof will be omitted. The second pull-down control signal generator 986 receives the pull-down data signal DN1 to output the pull-down control signal DNCODE< >.

Similar to the second embodiment, according to the third embodiment of the present invention, the number of bits of the pull-up and pull-down resistance-adjusting code signals PCODE< > and NCODE< > is reduced, and the pull-up and pull-down data signals UP1 and DN1 output in response to the high impedance signal is supplied to pull-up and pull-down pre-drivers driving pull-up and pull-down drivers having the smallest resistance/impedance. Thus, an output load of the pull-up and pull-down control signals UPCODE< > and DNCODE< > is minimized, and the number of elements is reduced. As a result, the skew of the data output signal is further decreased, and an area of the data output driver is reduced in comparison with the second embodiment.

According to the present invention, a data output driver is provided to reduce skew of an output data signal by reducing a load of a path through which pull-up and pull-down control signals are generated through a logic combination of data signals.

In addition, the number of bits of a resistance-adjusting code signal is reduced by enabling a most significant bit (MSB) of pull-up and pull-down calibration circuits of an ODT calibration circuit so as to simplify a path through which the pull-up and pull-down control signals are generated. As a result, the skew of the output data signal is reduced.

In addition, a data multiplexer is further provided which outputs a data signal according to high impedance information. Further, the path is simplified through which the pull-up and pull-down control signals are generated in response to the data signal output from the data multiplexer. As a result, the skew of the data output signal is reduced.

In addition, an area of the data output driver is reduced by simplifying the path through which the pull-up and pull-down control signals are generated.

In addition, the data output driver is suitable for low power by simplifying the path of the output circuit and reducing the load of the output circuit.

What is claimed is:

1. A data output driver comprising:
   a data multiplexer which provides a pull-up/pull-down data signal;
   an on-die termination calibration circuit which provides an N bit (N is a natural number) pull-up/pull-down resistance-adjusting code signal; and
   an output circuit coupled to the data multiplexer and the on-die termination circuit and which includes a plurality of pull-up/pull-down pre-drivers and a plurality of pull-up/pull-down drivers and outputs a data signal when the pull-up/pull-down drivers are driven in response to an M bit (M being a natural number) pull-up/pull-down control signal selected in response to an enable signal and obtained by a logic-combination of the pull-up/pull-down resistance-adjusting code signal and the pull-up/pull-down data signal.

2. The data output driver according to claim 1, wherein the enable signal is obtained from an extended mode resister set.

3. The data output driver according to claim 1, wherein each of the pull-up/pull-down pre-drivers includes pull-up/pull-down control signal generators, which generate the pull-up/pull-down control signal by the NAND combination of the pull-up/pull-down resistance-adjusting code signal and the pull-up/pull-down data signal.

4. The data output driver according to claim 3, wherein each of the pull-up/pull-down pre-drivers includes the pull-up/pull-down control signal generators as many as the number of bits of the pull-up/pull-down control signal.

5. The data output driver according to claim 3, wherein the pull-up control signal generator comprises: a driving element in which the pull-up resistance-adjusting code signal is NOR-combined with an inversion signal of the enable signal, a signal obtained by the NOR-combination is then NAND-combined with the pull-up data signal, and a signal obtained by the NAND-combination is then inverted to output a pull-up driving signal; and an output element which receives the pull-driving signal to output the pull-up control signal.

6. The data output driver according to claim 3, wherein the pull-down control signal generator comprises: a driving element in which an inversion signal of the pull-down resistance-adjusting code signal is NOR-combined with an inversion signal of the enable signal, and a signal obtained by the NOR-combination is then NAND-combined with the pull-down data signal to output a pull-down driving signal; and an output element which receives the pull-down driving signal to output the pull-down driving signal.

7. The data output driver according to claim 5, wherein the output element comprises: a CMOS inverter, which inverts the pull-up/pull-down driving signal; and a resistor, which receives an output of the CMOS inverter to output the pull-up/pull-down control signal.

8. The data output driver according to claim 6, wherein the output element comprises: a CMOS inverter, which inverts the pull-up/pull-down driving signal; and a resistor, which receives an output of the CMOS inverter to output the pull-up/pull-down control signal.

9. A data output driver comprising:
   a data multiplexer which provides a pull-up/pull-down data signal;
   an on-die termination calibration circuit which provides an N−1 bit (N is a natural number equal to or greater than 2) pull-up/pull-down resistance-adjusting code signal; and
   an output circuit which includes a plurality of pull-up/pull-down pre-drivers and a plurality of pull-up/pull-down drivers and outputs a data signal when the pull-up/pull-down drivers are driven in response to an M bit (M is a natural number) pull-up/pull-down control signal selected in response to an enable signal and obtained by a logic-combination of the pull-up/pull-down resistance-adjusting code signal and the pull-up/pull-down data signal.

10. The data output driver according to claim 9, wherein the enable signal is obtained from an extended mode resister set.

11. The data output driver according to claim 9, wherein the on-die termination calibration circuit includes a pull-up/pull-down calibration driver constructed with N pull-up/pull-down fingers and outputs the N−1 bit pull-up/pull-down resistance-adjusting code signal by allowing an output of a finger corresponding to the MSB of the pull-up/pull-down fingers to be fixed at an enable state.

12. The data output driver according to claim 9, wherein the pull-up/pull-down pre-driver comprises: N−1 first pull-up/pull-down control signal generators which logic-combine the pull-up/pull-down data signal, the pull-up/pull-down resistance-adjusting code signal, and the enable signal to generate the pull-up/pull-down control signal; and one second pull-up/pull-down control signal generator which logic-combines the pull-up/pull-down data signal and the enable signal to generate the pull-up/pull-down control signal.

13. The data output driver according to claim 12, wherein the first pull-up control signal generator comprises: a driving element in which the pull-up resistance-adjusting code signal is NOR-combined with an inversion signal of the enable signal, a signal obtained by the NOR-combination is then NAND-combined with the pull-up data signal, and a signal obtained by the NAND-combination is then inverted to output a pull-up driving signal; and an output element which receives the pull-driving signal to output the pull-up control signal.

14. The data output driver according to claim 12, wherein the first pull-down control signal generator comprises: a driving element in which an inversion signal of the pull-down resistance-adjusting code signal is NOR-combined with an inversion signal of the enable signal, and a signal obtained by the NOR-combination is then NAND-combined with the pull-down data signal to output a pull-down driving signal; and an output element which receives the pull-down driving signal to output the pull-down driving signal.

15. The data output driver according to claim 12, wherein the second pull-up control signal generator comprises: a driving element which NAND-combines and inverts the enable signal and the pull-up data signal to output a pull-up driving signal; and an output element which receives the pull-up driving signal to output the pull-up control signal.

16. The data output driver according to claim 12, wherein the second pull-down control signal generator comprises: a driving element which NAND-combines the enable signal and the pull-down data signal to output a pull-down driving signal; and an output element which receives the pull-down driving signal to output the pull-down control signal.

17. The data output driver according to claim 12, wherein the output element comprises: a CMOS inverter, which inverts the pull-up/pull-down driving signal; and a resistor which receives an output of the CMOS inverter to output the pull-up/pull-down control signal.

18. The data output driver according to claim 16, wherein the output element comprises: a CMOS inverter, which inverts the pull-up/pull-down driving signal; and a resistor which receives an output of the CMOS inverter to output the pull-up/pull-down control signal.

19. A data output driver comprising:
   a first data multiplexer which provides a first pull-up/pull-down data signal;

a second data multiplexer which provides a second pull-up/pull-down data signal in response to a high impedance signal provided from an extended mode resister set;

an on-die termination calibration circuit which provides an N−1 bit (N is a natural number equal to or greater than 2) pull-up/pull-down resistance-adjusting code signal; and an output circuit which includes a plurality of pull-up/pull-down pre-drivers and a plurality of pull-up/pull-down drivers and outputs a data signal when the pull-up/pull-down drivers are driven in response to an M bit (M is a natural number) pull-up/pull-down control signal selected in response to an enable signal and obtained by a logic-combination of the pull-up/pull-down resistance-adjusting code signal and the pull-up/pull-down data signal.

20. The data output driver according to claim 19, wherein the enable signal is obtained from an extended mode resister set.

21. The data output driver according to claim 19, wherein the second data multiplexer comprises: a selector which selectively outputs an input data signal at rising and falling edges of a clock signal; a switch which controls an output signal of the selector in response to the high impedance signal; and an output buffer which receives an output signal of the switch to transmit the second pull-up/pull-down data signal.

22. The data output driver according to claim 21, wherein the switch comprises: a PMOS transistor connected between an output stage and a power stage of the selector; and an NMOS transistor connected between the output stage and a ground stage of the selector.

23. The data output driver according to claim 21, wherein the switch comprises: a first switch which receives the output signal of the selector to transmit the second pull-up data signal when a power voltage is supplied to the gate of the PMOS transistor, and the high impedance signal is supplied to the gate of the NMOS transistor; and a second switch which receives the output signal of the selector to transmit the second pull-down data signal when the high impedance signal is supplied to the gate of the PMOS transistor, and a ground voltage is supplied to the gate of the NMOS transistor.

24. The data output driver according to claim 19, wherein the on-die termination calibration circuit includes a pull-up/pull-down calibration driver constructed with N pull-up/pull-down fingers and outputs the N−1 bit pull-up/pull-down resistance-adjusting code signal by allowing an output of a finger corresponding to the MSB of the pull-up/pull-down fingers to be fixed at an enable state.

25. The data output driver according to claim 19, wherein the pull-up/pull-down pre-driver comprises: first pull-up/pull-down pre-drivers which logic-combine the first pull-up/pull-down data signal and the enable signal to output the pull-up/pull-down control signal; and second pull-up/pull-down pre-drivers which receive the second pull-up/pull-down signal to output a pull-up/pull-down control signal.

26. The data output driver according to claim 25, wherein each of the first pull-up/pull-down pre-drivers comprises: N−1 first pull-up/pull-down control signal generators which receive the first pull-up/pull-down data signal, the enable signal, and the pull-up/pull-down resistance-adjusting code signal to output the pull-up/pull-down control signal; and one second pull-up/pull-down control signal generator which receives the first pull-up/pull-down data signal and the enable signal to output the pull-up/pull-down control signal.

27. The data output driver according to claim 26, wherein the first pull-up control signal generator comprises: a driving element in which the pull-up resistance-adjusting code signal is NOR-combined with an inversion signal of the enable signal, a signal obtained by the NOR-combination is then NAND-combined with the first pull-up data signal, and a signal obtained by the NAND-combination is then inverted to output a pull-up driving signal; and an output element which receives the pull-driving signal to output the pull-up control signal.

28. The data output driver according to claim 26, wherein the first pull-down control signal generator comprises: a driving element in which an inversion signal of the pull-down resistance-adjusting code signal is NOR-combined with an inversion signal of the enable signal, and a signal obtained by the NOR-combination is then NAND-combined with the first pull-down data signal to output a pull-down driving signal; and an output element which receives the pull-down driving signal to output the pull-down driving signal.

29. The data output driver according to claim 26, wherein the second pull-up control signal generator comprises: a driving element which NAND-combines and inverts the enable signal and the first pull-up data signal to output a pull-up driving signal; and an output element which receives the pull-up driving signal to output the pull-up control signal.

30. The data output driver according to claim 26, wherein the second pull-down control signal generator comprises: a driving element which NAND-combines the enable signal and the first pull-down data signal to output a pull-down driving signal; and an output element which receives the pull-down driving signal to output the pull-down control signal.

31. The data output driver according to claim 27, wherein the output element comprises: a CMOS inverter which inverts the pull-up/pull-down driving signal; and a resistor which receives an output of the CMOS inverter to output the pull-up/pull-down control signal.

32. The data output driver according to claim 30, wherein the output element comprises: a CMOS inverter which inverts the pull-up/pull-down driving signal; and a resistor which receives an output of the CMOS inverter to output the pull-up/pull-down control signal.

33. The data output driver according to claim 25, wherein each of the second pull-up/pull-down pre-drivers comprises: N−1 first pull-up/pull-down control signal generators which receive the second pull-up/pull-down data signal and the pull-up/pull-down resistance-adjusting code signal to output the pull-up/pull-down control signal; and one second pull-up/pull-down control signal generator which receives the second pull-up/pull-down data signal to output the pull-up/pull-down control signal.

34. The data output driver according to claim 33, wherein the first pull-up/pull-down comprises: a driving element which NAND-combines and inverts the pull-up resistance-adjusting code signal and the second pull-up data signal to output a pull-up driving signal; and an output signal which receives the pull-up driving signal to output the pull-up control signal.

35. The data output driver according to claim 33, wherein the first pull-down control signal generator comprises: a driving element which NAND-combines the pull-down resistance control code signal and the second pull-down data signal to output a pull-down driving signal; and an output element which receives the pull-down driving signal to output the pull-down control signal.

36. The data output driver according to claim 33, wherein the second pull-up control signal generator comprises: a driving element which buffers the second pull-up data signal to output a pull-up driving signal, and an output element which receives the pull-up driving signal to output the pull-up control signal.

37. The data output driver according to claim 33, wherein the second pull-down control signal generator comprises: a driving element which buffers the second pull-down data signal to output a pull-down driving signal; and an output element which receives the pull-down driving signal to output the pull-down control signal.

38. The data output driver according to claim 34, wherein the output element comprises: a CMOS inverter, which inverts the pull-up/pull-down driving signal; and a resistor which receives an output of the CMOS inverter to output the pull-up/pull-down control signal.

39. The data output driver according to claims 37, wherein the output element comprises: a CMOS inverter, which inverts the pull-up/pull-down driving signal; and a resistor which receives an output of the CMOS inverter to output the pull-up/pull-down control signal.

40. The data output driver according to claim 19, wherein the output driver comprises one or more pull-up/pull-down drivers each having a different resistance/impedance, and the pull-up/pull-down driver having a minimum resistance/impedance is driven in response to the pull-up/pull-down control signal generated in response to the second pull-up/pull-down data signal.

* * * * *